United States Patent [19]
Ho

[11] Patent Number: 5,557,243
[45] Date of Patent: Sep. 17, 1996

[54] OSCILLATION CIRCUIT WITH POWER LIMITING CONTROLLER

[75] Inventor: Joon-Cherl Ho, Seoul, Rep. of Korea

[73] Assignee: LG Semicon Co., Ltd., Seoul, Rep. of Korea

[21] Appl. No.: 425,068

[22] Filed: Apr. 19, 1995

[51] Int. Cl.$^6$ .............................. H03B 5/04; H03B 5/06; H03B 5/36
[52] U.S. Cl. .................... 331/158; 331/116 FE; 331/160; 331/173
[58] Field of Search ............. 331/116 FE, 158, 331/173, 116 R, 117 R, 117 FE, 111, 143, 160, 175, DIG. 3

[56] References Cited

U.S. PATENT DOCUMENTS

| | | |
|---|---|---|
| 4,321,562 | 3/1982 | Igarashi .................. 331/116 FE |
| 4,896,122 | 1/1990 | Tahernia et al. ............ 331/116 FE X |
| 5,041,802 | 8/1991 | Wei et al. .................. 331/116 FE |
| 5,150,081 | 9/1992 | Goldberg ................... 331/109 |
| 5,208,558 | 5/1993 | Shigehara et al. ........... 331/158 X |

*Primary Examiner*—David Mis

[57] ABSTRACT

An oscillation circuit employs a piezo-electric crystal connected in parallel with an amplifier having a gain equal to or less than that needed to maintain a steady-state operation of the amplifier when operated at the maximum output. One or more controllable amplifiers are connected in parallel with the amplifier and controlled according to the level of the oscillation signal, to rapidly amplify an initial oscillation to steady-state operation level and to keep it there without exceeding the output level of the crystal while minimizing the energy supplied to the entire oscillation circuit.

23 Claims, 5 Drawing Sheets

OSCILLATION CIRCUIT WITH POWER LIMITING CONTROLLER

BACKGROUND OF THE INVENTION

The present invention relates to an oscillation circuit, and more particularly, to an oscillation circuit for reducing power dissipation not only to a piezo-electric crystal but also to the entire oscillation circuit without the circuit being a particular operating frequency.

In an amplifier for generating a signal, for example, a clock signal of a semiconductor circuit, a maximum level of power dissipation of a piezoelectric crystal is established so as to not damage the crystal. When the crystal oscillation reaches the maximum level permitted, means are provided for limiting the driving signal applied so as to not damage crystal.

As shown in conventional art FIG. 1, an oscillation amplifier A10 made of a CMOS inverter receives an oscillation signal from piezo-electric crystal XT, inverts, and amplifies the received signal to a predetermined amplification degree. Series amplifiers A13 and A14 (each a CMOS inverter) apply the output of amplifier A14 to an output terminal of the oscillation circuit when a predetermined magnitude of oscillation wave form is output from oscillation amplifier A10. Crystal oscillator 100 has a resistance lower than 10 ohms, with the Q-factor being above 20,000.

The operation of the conventional oscillation circuit constructed as above will be described below.

In the conventional oscillation circuit 100, oscillation amplifier A10 amplifies the oscillation signal applied from piezo-electric crystal XT to a predetermined amplification degree and inverts the amplified signal. Oscillation detecting amplifiers A11 and A12 detect the magnitudes of oscillation signal at input node N00 and output node N10 of oscillation amplifier A10, respectively. Oscillation detecting amplifier A12 detects the negative amplitude of the oscillation signal, with oscillation detecting amplifier A11 detecting the positive amplitude of the oscillation signal. According to the detection result, if piezo-electric crystal XT oscillates above a predetermined level, MOS transistors M11 and M12 for limiting power are turned on by the output signals of oscillation detecting amplifies A11 and A12.

When the power provided by oscillation amplifier A10 equals the power consumed by the circuit, equilibrium is attained.

Since the power applied to piezo-electric crystal XT is limited as the MOS transistors M11 and M12 are turned on, power is applied to piezo-electric crystal XT so as to allow piezo-electric crystal XT to oscillate with a maximum power dissipation. The output wave form of the piezo-electric crystal XT is amplified through amplifiers A12 and A13, each made of a CMOS inverter, and applied to an output of the circuit.

The conventional oscillation circuit is advantageous in limiting the power applied to the piezo-electric crystal. However, the conventional oscillation circuit limits only the power applied to the piezo-electric crystal, with the power applied to the entire circuit being fixed. Thus, the power dissipation of the entire circuit is not reduced.

The limiting circuit for limiting the power applied to the crystal oscillator is made of N-type MOS transistors which are driven according to the oscillation wave form which oscillates positive and negative and is output from the oscillation detecting amplifier. Since the MOS transistors, which are power limiters, are not driven continuously, the power applied to the crystal oscillator is intermittently limited.

SUMMARY OF THE INVENTION

In order to overcome the above problems, it is an object of the present invention to provide an oscillation circuit in which controlled amplifiers which are connected in parallel with an amplifier used for making up dissipation losses of the circuit in steady state are disabled in sequence as the amplified signal level approaches a desired steady-state level of power.

It is a further object of the present invention to provide an oscillation circuit for detecting the oscillation wave form output from a crystal oscillator and providing amplification factor control of the entire circuit over a greater proportion of the duty cycle than the control provided in known conventional oscillator circuits.

It is still another object of the present invention to provide an oscillation circuit for limiting the power supplied to the entire oscillation circuit as opposed to limiting only the power supplied to the piezo-electric crystal so as to thereby reduce the power dissipation of the entire circuit.

To accomplish the above objects of the present invention, there is provided an oscillation circuit including first means for producing a first signal in response to an energizing signal applied as an input signal and for amplifying said first signal by varying degrees so as to form a second signal, and second means responsive to said second signal for controlling the degree of amplification of said first signal by said first means. There is also provided a method of controlling the power dissipation of an oscillation circuit comprising the steps of producing a first signal in response to an energizing signal applied as an input signal and for amplifying said first signal by varying degrees so as to form a second signal, and second means responsive to said second signal for controlling the degree of amplification of said first signal by said first means.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE ATTACHED DRAWINGS

The present invention will become more fully understood from the detailed description given hereinbelow and the accompanying drawings which are given by way of illustration only, and, thus, are not limitative of the present invention, and wherein.

DETAILED DESCRIPTION OF THE PREFERRED EMBODIMENTS

Hereinafter, preferred embodiments of an oscillation circuit of the present invention will be described with reference to the attached drawings.

Figure 1:
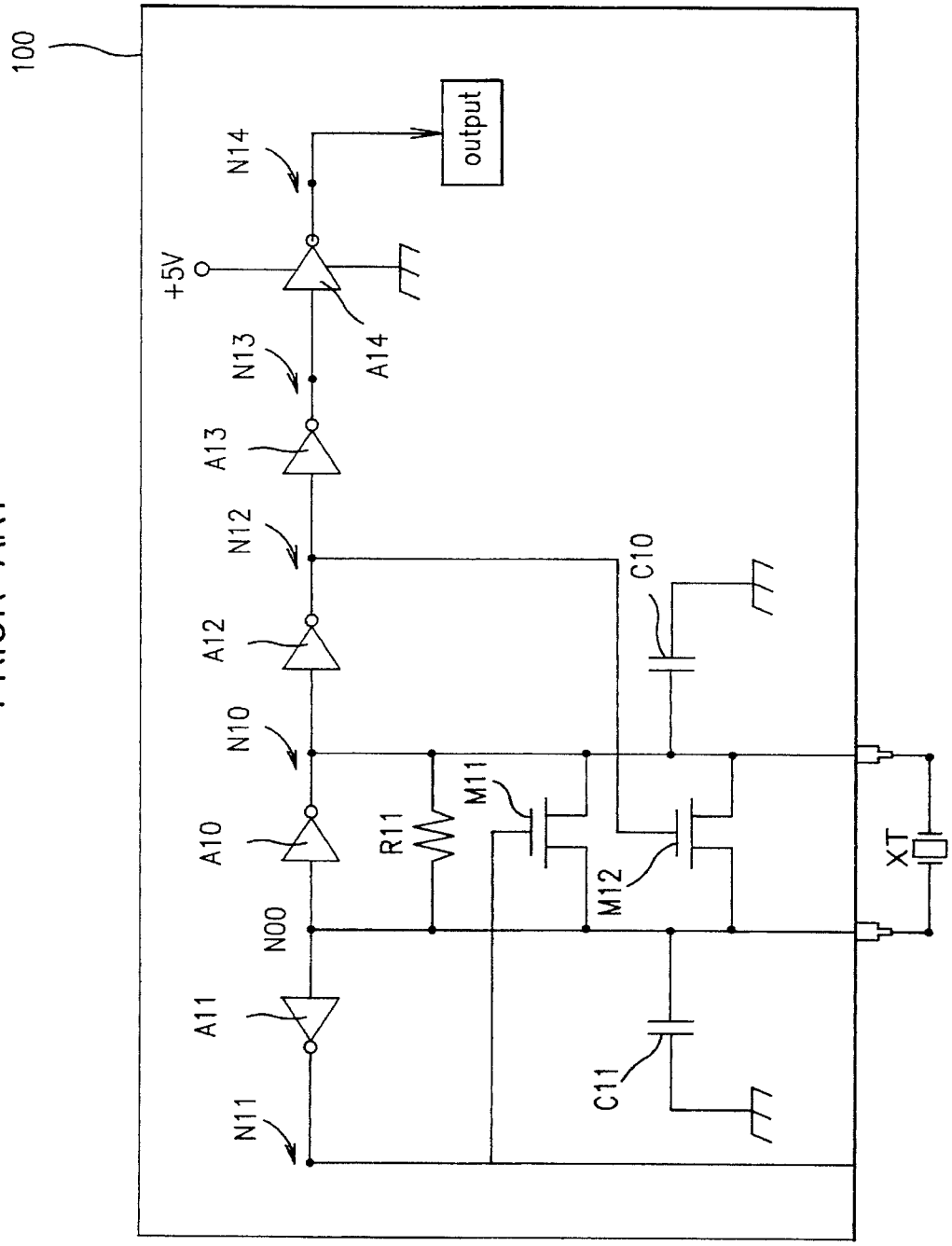
FIG. 1 is a detailed circuit diagram of the conventional oscillation circuit.
Figure 2:
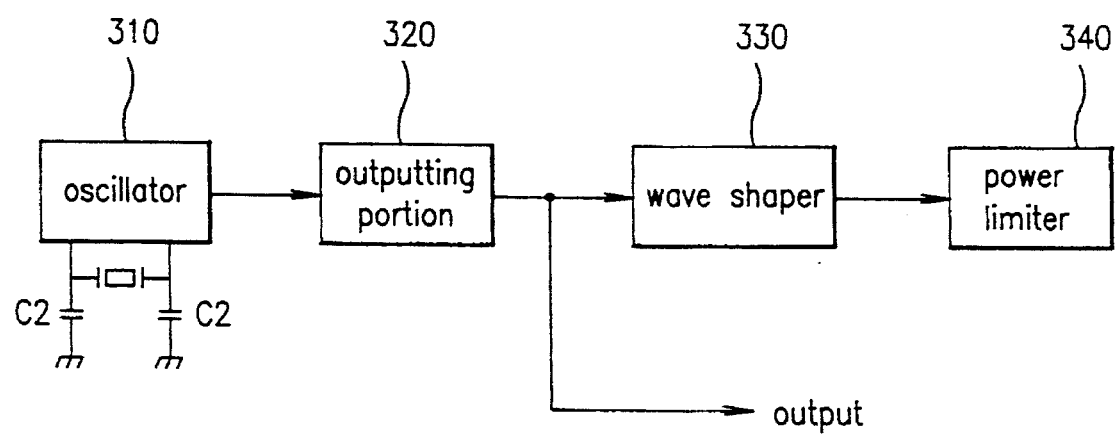
FIG. 2 is a block diagram of a first embodiment of an oscillation circuit of the present invention.
Figure 3:
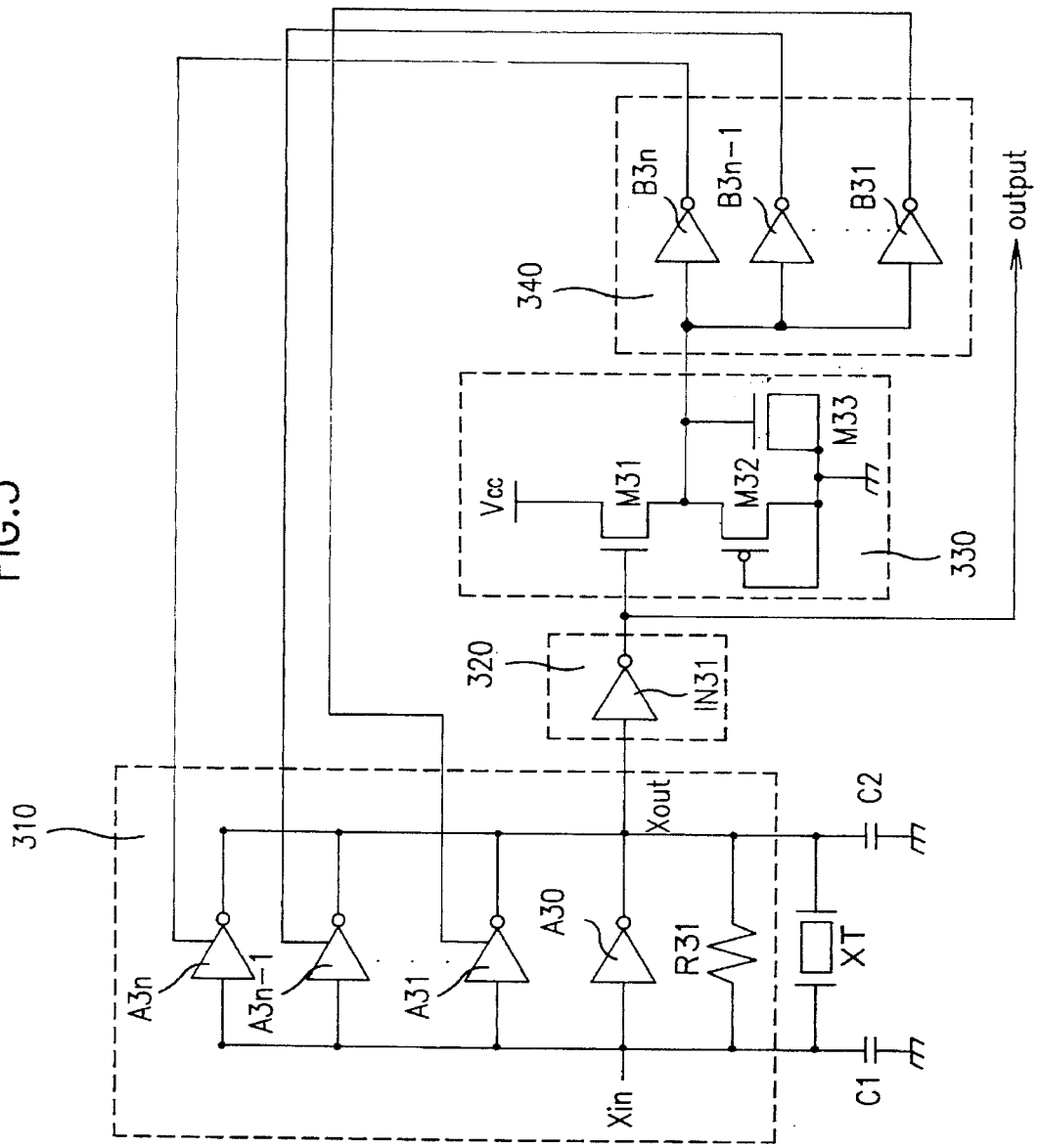
FIG. 3 is a detailed circuit diagram of the first embodiment of the oscillation circuit of the present invention.

Referring to FIGS. 2 and 3, one embodiment of an oscillation circuit of the present invention comprises an oscillator 310, an outputting portion 320 which includes an output, a wave-shaper 330, and a power limiter 340.

Oscillator 310 comprises a resistor R31 connected in parallel with a piezo-electric XT, an oscillation amplifier A30 connected in parallel with resistor R31 for amplifying an oscillation signal output from piezo-electric crystal XT to a predetermined amplification degree, inverting the amplified signal, and feeding back the result to piezo-electric crystal XT, and a plurality of tri-state amplifiers connected in parallel to oscillation amplifier A30 for limiting the power applied to amplifier A30. The plurality of amplifiers are made of tri-state CMOS amplifier/inverters A31–A3n for amplifying a signal, when there is an enable signal applied from power limiter 340, to a predetermined amplification degree.

The plurality of tri-state CMOS inverters A31–A3n of oscillator 310 are inverters driven by enable signals of the same logic threshold voltage. The inverters are connected in parallel with oscillation amplifier A30 and piezo-electric crystal XT so that the gain of amplifier 310 can be controlled by enabling/disabling the amplifiers A31 . . . A3n.

Outputting portion 320 receives the oscillation signal output from oscillator 310, amplifies the received oscillation signal by a factor which may be unity, and inverts it so as to provide an output of the oscillation circuit.

Wave-shaper 330 receives a portion of the output signal from outputting portion 320, rectifies, and smoothes the signal which is then used to control the amplifiers A31 . . . A3n. Transistor M31 acts as a diode, N-type MOS transistor M33 acts as a capacitor driven according to N-type MOS transistor M31 for performing a charging/discharging operation which smoothes out the signal, and a P-type MOS transistor M32 acts as a resistor having a large resistance. Thus, most of the output of N-type MOS transistor M31 is supplied to power limiter 340.

Figure 6:
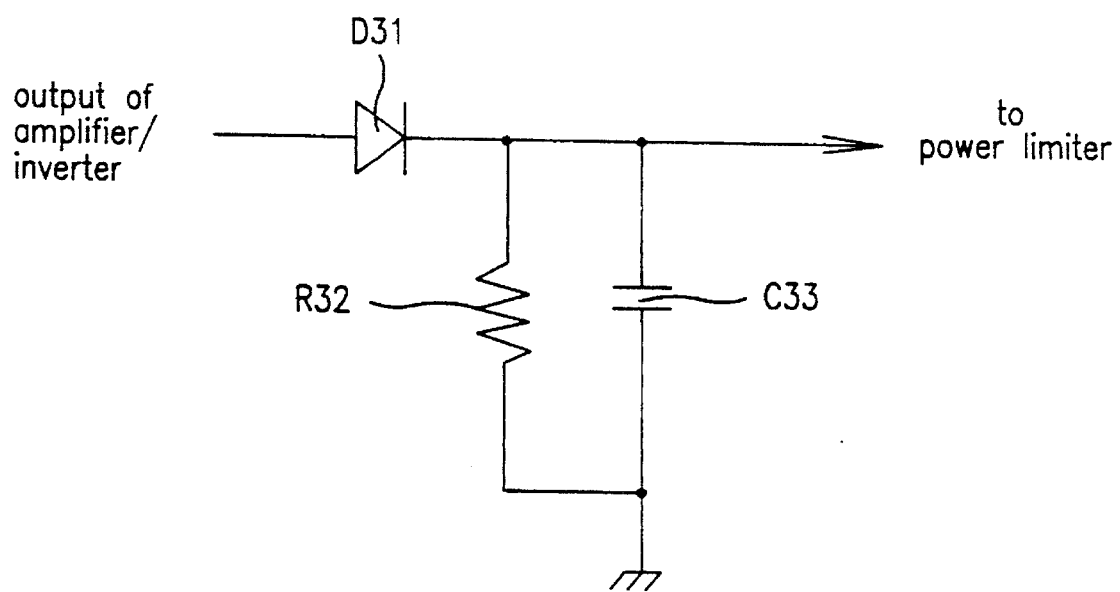
FIG. 6 is an equivalent circuit diagram of the wave-shaper circuit 330.

An equivalent circuit for the above circuit is shown in FIG. 6. Here, an N-type MOS transistor can be used instead of a P-type MOS transistor M32 acting as a resistor. In this case, the circuit is constructed so that a power voltage is applied to the gate and drain of the N-type MOS transistor.

Power limiter 340 limits the power of oscillator 310 according to the output of outputting portion 320. Power limiter 340 is made up of a plurality of parallel-connected CMOS inverters B31–B3n of different logic threshold voltages.

The operation of the oscillation circuit of the first embodiment of the present invention will be explained below.

In oscillator 310, a plurality of CMOS inverters A31–A3n are connected in parallel with piezo-electric crystal XT so that, when initially deformed by a voltage applied at either of terminal 1 or 2, it oscillates according to its natural operation frequency with increasing amplitude.

More specifically, at first the amplitude of the oscillation wave form applied from oscillator 310 through outputting portion 320 is small so that N-type MOS transistor M31 acting as a diode is turned off. Since the gate and source of P-type MOS transistor M32 acting as a resistor are connected to the ground, the P-type MOS transistor is always turned on. Thus, initially, a low-state signal is output from wave-shaper 330 and applied to power limiter 340.

CMOS inverters B31–B3n of power limiter 340 output high-state signals according to the output of wave-shaper 330. The high-state output signals are applied to enable ports of tri-state CMOS inverters A31–3n corresponding to oscillator 310 so that the tri-state CMOS inverters are initially all enabled.

The oscillation signal of oscillator 310 is applied to wave-shaper 330 through outputting portion 320 in order to prevent the power dissipation of piezo-electric crystal XT from exceeding its safe operating level. That is, the oscillation wave form is applied to wave-shaper 330 through outputting portion 320 so that N-type MOS transistor M31 of wave-shaper 330 is turned on by the positive oscillation signal. Therefore, N-type MOS transistor M33 acting as a capacitor is charged with a voltage. Here, the gate and source of P-type MOS transistor M32 acting as a resistor are connected to the ground and thus PMOS transistor M32 is always turned on. However, the P-type MOS transistor is designed to have a large resistance so that most of the output of outputting portion 320 is applied to power limiter 340.

N-type MOS transistor M31 of wave-shaper 330 is turned off by the negative oscillation signal so that the voltage charged in N-type MOS transistor M33 acting as a capacitor is discharged through P-type MOS transistor M32 acting as a resistor.

According to the positive and negative oscillation wave form of outputting portion 320, N-type MOS transistor M31 repeats charging and discharging operations. Here, since P-type MOS transistor M32 is designed to have a sufficiently large resistance, N-type MOS transistor M31 is recharged by the positive oscillation wave form from outputting portion 320 before the voltage charged in the transistor is discharged completely. In this manner N-type MOS transistor M31 repeats the charging/discharging operations according to the output signal of outputting portion 320 so that the rectified signal of M1 acting as a diode is smoothed out and applied to power limiter 340.

Among the plurality of CMOS inverters B31–B3n of power limiter 340 connected in parallel and having different logic threshold voltages, a CMOS inverter having a corresponding logic threshold voltage less than the signal input thereto is driven according to the signal applied from wave-shaper 330.

According to the output signal of wave-shaper 330, power limiter 340 outputs a signal. Initially, out of amplifiers A31–A3n of oscillator 310 none are disabled. As the oscillation grows and approaches the maximum level permitted to not exceed the power handling capability of piezo-electric crystal XT, the amplifiers are disabled in sequence.

Thus, in order to limit the power applied to the piezo-electric crystal, the controlled amplifiers of the oscillator are disabled according to the operation of the power limiter, to thereby reduce the power consumption of the entire circuit as well as that of the crystal oscillator.

Figure 5:
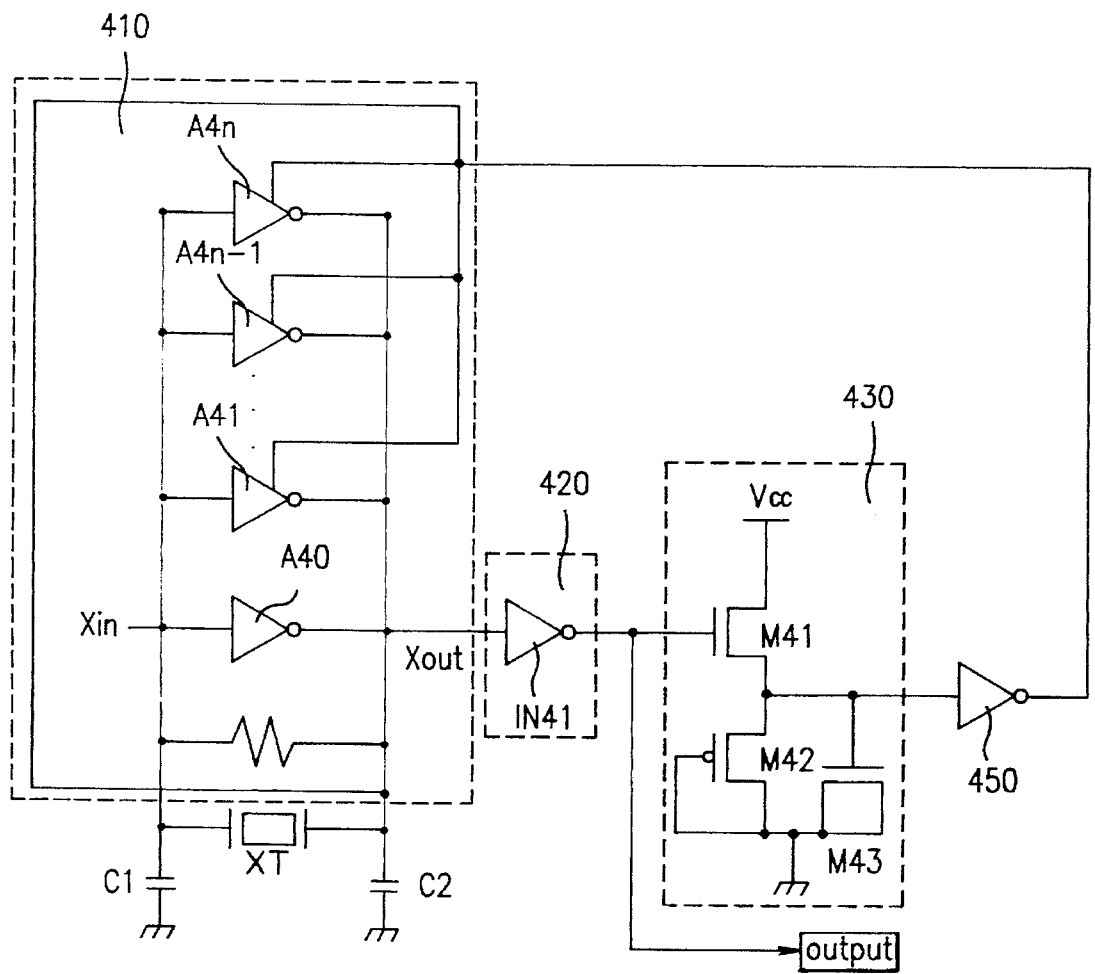
FIG. 5 is a detailed circuit diagram of the second embodiment of the present invention.

FIG. 5 is a block diagram of another embodiment of the oscillation circuit of the present invention. FIG. 6 is a detailed circuit diagram of the oscillation circuit.

Figure 4:
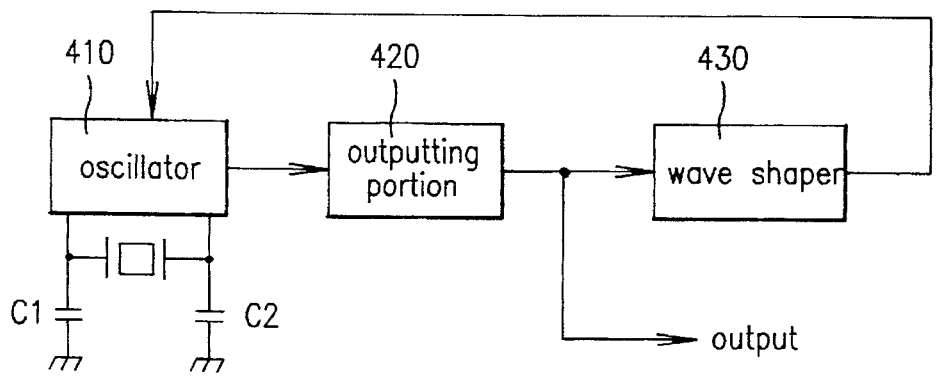
FIG. 4 is a block diagram of a second embodiment of the oscillation circuit of the present invention.

Referring to FIGS. 4 and 5, the second embodiment differs from the first embodiment in deleting power limiter 340 as shown in FIG. 3 and using controlled amplifiers A41 . . . A4n having different thresholds with a single inverter 450 of low threshold. Thus, further description of this embodiment will be omitted. As those of ordinary skill in the art would immediately recognize, the power limiter 340 of FIG. 3 can be omitted by having amplifiers A41–A4n of oscillator 410 composed of CMOS inverters driven by enable signals of different logic threshold voltages so that oscillator 410 performs the function of power limiter 340 using invertor 450.

The operation of the oscillation circuit of the present invention will be described below.

Oscillator 410 receives the oscillation wave form output from piezo-electric crystal XT, and amplifies and inverts the received wave form through oscillation amplifier A40. The amplified and inverted result is fed back to piezo-electric crystal XT.

At the initial state, the output of wave-shaper 430 is low and tri-state CMOS inverters A41–A4n are all enabled by the inverted output signal of wave-shaper 430. Oscillator 410 outputs an oscillation wave form amplified to an amplification degree which is determined by the parallel-connected amplifiers.

The oscillation wave form of oscillator 410 is applied to wave-shaper 430 through outputting portion 420. When the oscillation wave form, oscillating positive and negative and applied through outputting portion 420, is applied to wave-shaper 430, N-type MOS transistor M41 of wave-shaper 430 is turned on or off by the positive and negative output signals so that N-type MOS transistor M41 repeats charging and discharging operations. Similar to that of the first embodiment, wave-shaper 430 applies a signal according to the charging/discharging operation of N-type MOS transistor M41. A plurality of parallel/multistage-connected tri-state CMOS inverters A41–A4n of oscillator 410 having enable signals of different logic threshold voltages are driven by the wave-shaped signal applied from wave-shaper 430. As described above, among the parallel tri-state CMOS inverters A41–A4n, various tri-state CMOS inverters are disabled as the initial oscillation grows so that the crystal oscillator outputs an oscillation wave form while not surpassing the maximum level of power dissipation. Thus, the power applied to piezo-electric crystal XT as well as to the entire circuit is limited.

In this manner as the oscillation signal amplitude growth approaches a steady-state, the number of amplifiers disabled is increased among the plurality of amplifiers A41–A4n. Accordingly, oscillator 410 operates at a power level which does not surpass the maximum level of power dissipation of piezo-electric crystal XT.

Further, in this invention, the oscillation wave form of the crystal oscillator is maintained by using an N-MOS transistor for a capacitor so that the output of the crystal oscillator can be detected continuously. This enables the power applied to the crystal oscillator to be continuously limited. As a result, the embodied invention prevents improper operation of the oscillator.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. An oscillation circuit comprising:

first means for producing a first signal in response to an energizing signal being applied as an input signal, and for amplifying said first signal by varying degrees so as to form a second signal; and second means, responsive to said second signal, for controlling the degree of amplification of said first signal by said first means, said first means including a plurality of amplifiers arranged in parallel with one of said amplifiers being controlled by said second means, said second means controlling the degree of amplification by enabling/disabling said one of said amplifiers controlled by said second means, wherein said one of said amplifiers controlled by said second means is a tri-state amplifier which is controlled by a power limiting amplifier having a predetermined threshold value of input required before producing an output sufficient to disable the controlled amplifier.

2. The oscillation circuit of claim 1, wherein said first means comprises a piezo-electric crystal which receives said input signal and generates said first signal.

3. The oscillation circuit of claim 1, wherein there are at least three of said amplifiers arranged in parallel, with at least two of said amplifiers controlled by said second means.

4. The oscillator circuit of claim 1, wherein said second means controls the degree of amplification by selectively enabling/disabling at least two of said amplifiers controlled by said second means.

5. The oscillator circuit of claim 1, wherein said amplifiers include identical threshold tri-state amplifiers controlled by power limiting amplifiers each having a different threshold value of input required before producing an output sufficient to disable the controlled amplifiers.

6. The oscillation circuit of claim 1, wherein said amplifiers include inverting tri-state MOS amplifiers.

7. The oscillation circuit of claim 1, wherein said first means comprises an inverting amplifier arranged in series with said amplifiers arranged in parallel.

8. The oscillation circuit of claim 1, wherein said second means includes a wave-shaping circuit having N-type MOS transistors and a P-type MOS transistor for repeating charging and discharging operations of the oscillation circuit.

9. A method of minimizing power to an oscillation circuit comprising the steps of:

producing a first signal in response to an energizing signal being applied as an input signal;

amplifying said first signal by varying degrees so as to form a second signal; and controlling, in response to said second signal, the degree of amplification of said first signal, wherein in said controlling step, controlling at least one controllable amplifier arranged in parallel with a piezo-electric crystal to control the degree of amplification, said at least one amplifier being a tri-state amplifier controlled by a power limiting amplifier having a predetermined threshold value of input required before producing an output sufficient to disable the controlled amplifier, and wherein, in said amplifying and controlling steps, using inverting amplifiers.

10. The method of claim 9, wherein said step of producing a first signal includes receiving said input signal and applying said input signal to a piezo-electric crystal which generates said first signal.

11. The method of claim 9, wherein the degree of amplification is controlled by enabling/disabling said controllable amplifier.

12. The method of claim 9, wherein, in the controlling step, multiple amplifiers arranged in parallel with the piezoelectric crystal are controlled to control the degree of amplification.

13. The method of claim 12, wherein, in the controlling step, the controlled amplifiers are controlled by enabling/disabling the amplifiers.

14. The method of claim 13, wherein the controlling step includes enabling/disabling power amplifiers having differing threshold values of input required before producing an output sufficient to enable/disable the controlled amplifiers.

15. The method of claim 9, wherein said amplifiers include inverting tri-state MOS amplifiers.

16. The method of claim 9, wherein in said controlling step, N-type MOS transistors and a P-type MOS transistor are used to repeat charging and discharging operations of the oscillation circuit.

17. The method of claim 12, wherein the output of said multiple amplifiers arranged in parallel is inverted by an inverting amplifier arranged in series with said multiple amplifiers.

18. An oscillation circuit comprising:

first means for producing a first signal in response to an energizing signal being applied as an input signal, and for amplifying said first signal by varying degrees so as to form a second signal; and second means, responsive to said second signal, for controlling the degree of amplification of said first signal by said first means, said first means including at least three amplifiers arranged in parallel with two of said amplifiers being controlled by said second means, said second means controlling the degree of amplification by enabling/disabling said two of said amplifiers, wherein said two of said amplifiers are non-identical threshold tri-state amplifiers.

19. The oscillation circuit of claim 18, wherein said first means includes an inverting amplifier arranged in series with said amplifiers arranged in parallel.

20. The oscillation circuit of claim 18, wherein said first means includes a piezo-electric crystal which receives said input signal and generates said first signal, and said second means includes a wave-shaping circuit having N-type MOS transistors and a P-type MOS transistor for repeating charging and discharging operations of the oscillation circuit.

21. A method of controlling an oscillation circuit, comprising the steps of:

producing a first signal in response to an energizing signal being applied as an input signal;

amplifying said first signal by varying degrees so as to form a second signal; and controlling, in response to said second signal, the degree of amplification of said first signal, wherein in said controlling step, a plurality of non-identical threshold tri-state amplifiers arranged in parallel with a piezo-electric crystal are used to control the degree of amplification, the degree of amplification being controlled by enabling/disabling at least one of said amplifiers.

22. The method of claim 21, wherein the degree of amplification is controlled by selectively enabling/disabling said tri-state amplifiers.

23. The method of claim 21, wherein in said controlling step, N-type MOS transistors and a P-type MOS transistor are used to repeat charging and discharging operations of the oscillation circuit.

* * * * *